(12) United States Patent
Chen et al.

(10) Patent No.: US 10,337,118 B2
(45) Date of Patent: Jul. 2, 2019

(54) APPARATUS AND METHOD FOR DOPING A SEMICONDUCTOR MELT COMPRISING A SEED CHUCK, A SEED CRYSTAL CONNECTED TO THE SEED CHUCK, AND A DOPANT CONTAINER CONNECTED TO THE SEED CHUCK BETWEEN A FIRST AND SECOND END OF THE APPARATUS

(71) Applicant: Corner Star Limited, Kowloon (HK)

(72) Inventors: Jihong Chen, Cincinnati, OH (US);
Joseph Holzer, St. Peters, MO (US)

(73) Assignee: Corner Star Limited, Kowloon (HK)

( * ) Notice: Subject to any disclaimer, the term of this patent is extended or adjusted under 35 U.S.C. 154(b) by 0 days.

(21) Appl. No.: 15/531,346

(22) PCT Filed: Nov. 24, 2015

(86) PCT No.: PCT/US2015/062399
§ 371 (c)(1),
(2) Date: May 26, 2017

(87) PCT Pub. No.: WO2016/085969
PCT Pub. Date: Jun. 2, 2016

(65) Prior Publication Data
US 2017/0356099 A1    Dec. 14, 2017

Related U.S. Application Data

(60) Provisional application No. 62/084,677, filed on Nov. 26, 2014.

(51) Int. Cl.
*C30B 15/04* (2006.01)
*C30B 15/00* (2006.01)
(Continued)

(52) U.S. Cl.
CPC .......... *C30B 15/04* (2013.01); *C30B 15/002* (2013.01); *C30B 15/12* (2013.01); *C30B 15/32* (2013.01); *C30B 29/06* (2013.01)

(58) Field of Classification Search
CPC ....... C30B 15/00; C30B 15/002; C30B 15/02; C30B 15/04; C30B 15/10; C30B 15/12;
(Continued)

(56) References Cited

U.S. PATENT DOCUMENTS

| 4,547,258 A | 10/1985 | Witter et al. |
| 5,242,531 A | 9/1993 | Klingshirn et al. |

(Continued)

FOREIGN PATENT DOCUMENTS

| CN | 202131395 U | 2/2012 |
| JP | S59156993 A | 9/1984 |

(Continued)

OTHER PUBLICATIONS

International Search Report and Written Opinion of the International Searching Authority regarding PCT/US2015/062399 dated Feb. 10, 2016; pp. 1-10.

*Primary Examiner* — Kenneth A Bratland, Jr.
(74) *Attorney, Agent, or Firm* — Armstrong Teasdale LLP (57) ABSTRACT

An apparatus for doping a melt of semiconductor or solar-grade material is provided. The apparatus includes a seed chuck, a seed crystal connected to the seed chuck, and a dopant container connected to the seed chuck. The seed chuck defines a first end of the apparatus, and the seed crystal defines a second end of the apparatus. The seed crystal is configured to initiate crystal growth when placed in contact with the melt. The dopant container is positioned between the first end and the second end of the apparatus, and defines a reservoir for holding dopant therein. The dopant container is configured to dispense liquid dopant into (Continued)

the melt when positioned proximate the melt. The dopant container and the seed crystal are connected to the seed chuck simultaneously.

21 Claims, 6 Drawing Sheets

(51) Int. Cl.
*C30B 15/12* (2006.01)
*C30B 15/32* (2006.01)
*C30B 29/06* (2006.01)

(58) Field of Classification Search
CPC ......... C30B 15/20; C30B 15/32; C30B 29/00; C30B 29/02; C30B 29/06; Y10T 117/00; Y10T 117/10; Y10T 117/1024; Y10T 117/1032; Y10T 117/1052; Y10T 117/1056
USPC ............... 117/11, 13, 19, 21, 200, 206, 208, 117/213–214, 911, 928, 931–932
See application file for complete search history.

(56) References Cited

U.S. PATENT DOCUMENTS

| | | |
|---|---|---|
| 5,866,094 A | 2/1999 | Niikura |
| 6,019,838 A | 2/2000 | Canella |
| 7,132,091 B2 | 11/2006 | Kulkarni et al. |
| 2001/0015167 A1 | 8/2001 | Weber et al. |
| 2010/0151667 A1 | 6/2010 | Narushima et al. |
| 2012/0056135 A1* | 3/2012 | DeLuca ................. C30B 15/04 252/512 |

FOREIGN PATENT DOCUMENTS

| | | | |
|---|---|---|---|
| JP | 2005272265 A | 10/2005 | |
| JP | 2012066965 A | 4/2012 | |
| JP | 2005336020 A | 12/2015 | |
| KR | 100777337 B1 | 11/2007 | |
| KR | 10-2014-0094803 | * 7/2014 | |
| WO | 9428207 A1 | 12/1994 | |
| WO | WO-2013025024 A2 * | 2/2013 | ............ C30B 29/06 |

* cited by examiner

APPARATUS AND METHOD FOR DOPING A SEMICONDUCTOR MELT COMPRISING A SEED CHUCK, A SEED CRYSTAL CONNECTED TO THE SEED CHUCK, AND A DOPANT CONTAINER CONNECTED TO THE SEED CHUCK BETWEEN A FIRST AND SECOND END OF THE APPARATUS

CROSS REFERENCE TO RELATED APPLICATIONS

This application is a National Stage application of International Application No. PCT/US2015/062399, filed on Nov. 24, 2015, which claims priority to U.S. Provisional Application No. 62/084,677, filed Nov. 26, 2014, the disclosures of which are hereby incorporated by reference in their entirety.

FIELD

The field of the disclosure relates generally to systems and methods for producing ingots of semiconductor or solar-grade material from a melt and, more particularly, to systems and methods for introducing volatile dopants into a melt of semiconductor or solar-grade material.

BACKGROUND

In the production of silicon crystals grown by the continuous Czochralski (CCZ) method, polycrystalline silicon is first melted within a crucible, such as a quartz crucible, of a crystal pulling device to form a silicon melt. The puller then lowers a seed crystal into the melt and slowly raises the seed crystal out of the melt. As the seed crystal is grown from the melt, solid polysilicon or liquid silicon is added to the melt to replenish the silicon that is incorporated into the growing crystal.

Desired amounts of dopants are added to the melt to modify the base resistivity of the resulting monocrystalline ingot. In some instances, it is desirable to use volatile dopants in the silicon crystal growth process, such an indium, antimony, and gallium. For example, it is desirable to use indium as a dopant in crystals used for solar structures due to an increased performance in indium-doped solar structures as compared to boron doped solar structures. Use of volatile dopants in the CCZ process presents several challenges, however. For example, due to the volatile nature of such dopants, a significant amount of dopant may be lost to evaporation during the process, making the crystal growing process costly. Additionally, loss of dopant during the growth process makes controlling the dopant concentration of the melt difficult.

While some known systems address some of the above problems associated with the use of volatile dopants, most known systems for doping a melt in a CCZ process with a volatile dopant do not provide a sufficiently uniform resistivity profile at the seed end of grown crystals. For example, to reduce losses associated with evaporation of volatile dopants, some systems add dopants to the melt just prior to initiation of the crystal growing process. Such systems generally add dopant to an outer melt zone to avoid disturbing the melt surface in the inner melt zone, which can result in a loss of crystal structure during the growth process. Diffusion of the dopant to the inner melt zone is relatively slow. Thus, the dopant is primarily transported to the inner melt zone by the physical flow of the liquid melt towards the inner melt zone. Because such systems generally add dopant to the outer melt zone, the initial portion of the grown crystal (i.e., the seed end) has a significantly lower dopant concentration than the remainder of the crystal, and thus, a higher resistivity. This region of the grown crystal is sometimes referred to as the "high resistivity transient region". The high resistivity transient region is not typically used in subsequent device fabrication, resulting in productivity losses and increased costs of production.

Accordingly, a need exists for an apparatus and method that reduces or eliminates the high resistivity transient region in semiconductor or solar grade crystals grown according to the CCZ method.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, an apparatus for doping a melt of semiconductor or solar-grade material is provided. The apparatus includes a seed chuck, a seed crystal connected to the seed chuck, and a dopant container connected to the seed chuck. The seed chuck defines a first end of the apparatus, and the seed crystal defines a second end of the apparatus. The seed crystal is configured to initiate crystal growth when placed in contact with the melt. The dopant container is positioned between the first end and the second end of the apparatus, and defines a reservoir for holding dopant therein. The dopant container is configured to dispense liquid dopant into the melt when positioned proximate the melt. The dopant container and the seed crystal are connected to the seed chuck simultaneously.

In another aspect, a system for growing an ingot from a melt of semiconductor or solar-grade material is provided. The system includes a crucible for containing the melt of semiconductor or solar-grade material, a crystal puller for pulling the ingot from the melt, and a doping apparatus connected to the crystal puller. The doping apparatus includes a seed chuck, a seed crystal connected to the seed chuck, and a dopant container connected to the seed chuck. The seed crystal is configured to initiate crystal growth when placed in contact with the melt. The dopant container defines a reservoir for holding dopant therein, and is configured to liquefy and dispense dopant to the melt and initiate crystal growth with the seed crystal.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
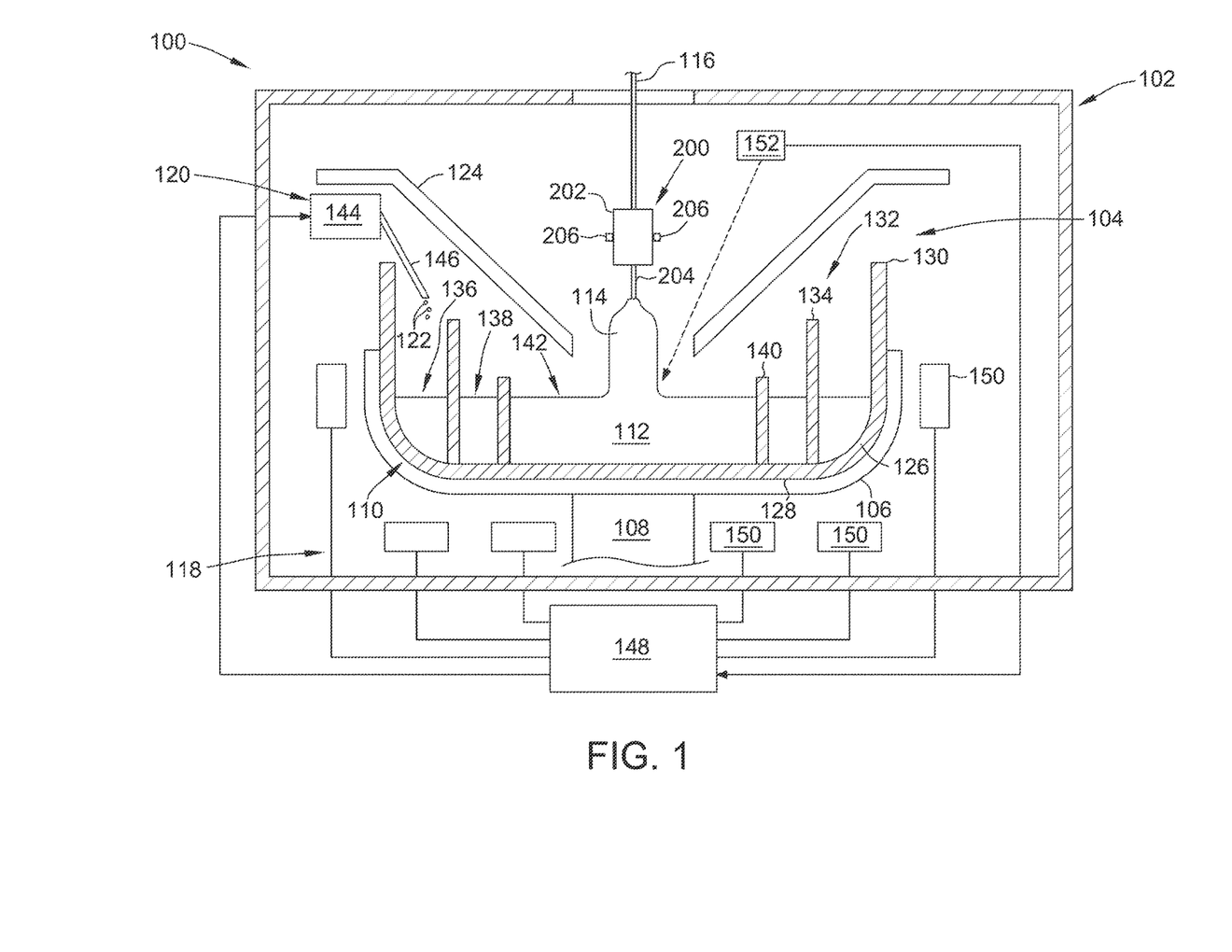
FIG. 1 is cross-section of a crystal growing system including a suitable embodiment of a doping apparatus.

Referring to FIG. 1, a crystal growing system is shown schematically and is indicated generally at 100. The crystal growing system 100 is used to produce a single crystal ingot by a Czochralski method. As discussed herein, the system is described in relation to the continuous Czochralski method of producing single crystal ingots, though a batch process may be used. For example, the process may be used in a "recharge" CZ process.

The illustrated crystal growing system 100 includes a housing 102 defining a growth chamber 104, a susceptor 106 supported by a rotatable shaft 108, a crucible assembly 110 that contains a melt 112 of semiconductor or solar-grade material (e.g., silicon) from which an ingot 114 is being pulled by a crystal puller 116, a heating system 118 for supplying thermal energy to the system 100, and a doping apparatus, indicated generally at 200, for introducing dopant into the melt 112. The illustrated system 100 also includes a feed system 120 for feeding solid or liquid feedstock material 122 into the crucible assembly 110 and/or the melt 112, and a heat shield 124 configured to shield the ingot 114 from radiant heat from the melt 112 to allow the ingot 114 to solidify.

The housing 102 encloses the susceptor 106, the crucible assembly 110, and portions of the heating system 118 within the growth chamber 104. In use, the housing 102 may be used to seal the growth chamber 104 from the external environment, and inert gas, such as argon, may be supplied to the growth chamber 104. Suitable materials from which the housing 102 may be constructed include, but are not limited to, stainless steel.

The crucible assembly 110 includes a crucible 126 having a base 128 and a generally annular sidewall 130 extending around the circumference of the base 128. Together, the base 128 and the sidewall 130 define a cavity 132 of the crucible 126 within which the melt 112 is disposed. The crucible 126 may be constructed of any suitable material that enables the system 100 to function as described herein, including, for example, quartz.

The crucible assembly 110 also includes a plurality of weirs that separate the melt 112 into different melt zones. In the illustrated embodiment, the crucible assembly 110 includes a first weir 134 separating an outer melt zone 136 of the melt 112 from an inner melt zone 138 of the melt 112, and a second weir 140 at least partially defining a growth zone 142 from which the crystal ingot 114 is pulled. The first weir 134 and the second weir 140 each have a generally annular shape, and have at least one opening defined therein to permit the melt 112 to flow radially inward towards the growth zone 142. The first weir 134 and the second weir 140 are disposed within the cavity 132 of the crucible 126, and create a circuitous path from the outer melt zone 136 to the inner melt zone 138 and the growth zone 142. The weirs 134, 140 thereby facilitate melting solid feedstock material 122 before it reaches an area immediately adjacent to the growing crystal (e.g., the growth zone 142). The weirs 134, 140 may be constructed from any suitable material that enables the system 100 to function as described herein, including, for example, quartz. While the illustrated embodiment is shown and described as including two weirs, the system 100 may include any suitable number of weirs that enables the system 100 to function as described herein, such as such as one weir, three weirs, and four weirs.

The crucible 126, the first weir 134, and the second weir 140 may be formed separately from one another, and assembled to form the crucible assembly 110. In other suitable embodiments, the crucible assembly 110 may have a unitary construction. That is, the crucible 126 and one or both weirs 134, 140 may be integrally formed (e.g., formed from a unitary piece of quartz).

The doping apparatus 200 is connected to the crystal puller 116, and generally includes a seed chuck 202, a seed crystal 204, and a pair of dopant containers 206. The doping apparatus 200 is configured to liquefy solid dopant contained within the dopant containers 206, and introduce the liquefied dopant into the melt 112 (e.g., within the inner melt zone 138). The doping apparatus 200 is further configured to initiate crystal growth of the ingot 114 with the seed crystal 204 prior to, during, or subsequent to doping the melt 112.

The feed system 120 includes a feeder 144 and a feed tube 146. Solid feedstock material 122 may be placed into the outer melt zone 136 from the feeder 144 through the feed tube 146 to replenish the melt 112 and maintain a desired dopant concentration in the melt 112. The amount of feedstock material 122 added to the melt 112 may be controlled by a controller (such as the controller 148, described below) based on a temperature reduction in the melt 112 resulting from the cooler feedstock material 122 being added to the melt 112.

The heat shield 124 is positioned adjacent the crucible assembly 110, and separates the melt 112 from an upper portion of the system 100. The heat shield 124 is configured to shield the ingot 114 from radiant heat generated by the melt 112 and the heating system 118 to allow the ingot 114 to solidify. In the example embodiment, the heat shield 124 includes a conical member separating the melt 112 from an upper portion of the system 100, and a central opening defined therein to allow the ingot 114 to be pulled therethrough. In other embodiments, the heat shield 124 may have any suitable configuration that enables the system 100 to function as described herein. In the example embodiment, the heat shield 124 is constructed from graphite. In other embodiments, the heat shield 124 may be constructed from any suitable material that enables the system 100 to function as described herein, including, for example, silica-coated graphite, high purity molybdenum, and combinations thereof.

The heating system 118 is configured to melt an initial charge of solid feedstock material (such as chunk polysilicon), and maintain the melt 112 in a liquefied state after the initial charge is melted. The heating system 118 includes a plurality of heaters 150 arranged at suitable positions about the crucible assembly 110. In the illustrated embodiment, each heater 150 has a generally annular shape. Two heaters are positioned beneath the crucible 126 and the susceptor 106, and one heater is positioned around and radially outward of the sidewall 130 of the crucible 126.

In the example embodiment, the heaters 150 are resistive heaters, although the heaters 150 may be any suitable heating device that enables the system 100 to function as described herein. Further, while the illustrated embodiment is shown and described as including three heaters 150, the system 100 may include any suitable number of heaters 150 that enables the system 100 to function as described herein.

The heaters 150 are connected to the controller 148, which controls the electric energy provided to the heaters 150 to control the amount of thermal energy supplied by the heaters 150. The amount of current supplied to each of the heaters 150 by the controller 148 may be separately and independently controlled to optimize the thermal characteristics of the melt 112. In the illustrated embodiment, the controller 148 also controls feed system 120 and the delivery of feedstock material 122 to the melt 112 to control the temperature of the melt 112.

A sensor 152, such as a pyrometer or like temperature sensor, provides a continuous measurement of the temperature of melt 112 at the crystal/melt interface of the growing single crystal ingot 114. Sensor 152 also may be configured to measure the temperature of the growing ingot 114. Sensor 152 is communicatively coupled with controller 148. Additional temperature sensors may be used to measure and provide temperature feedback to the controller 148 with respect to other areas of the melt 112 that are relevant to the melting of the feedstock material 122 or in controlling the growing ingot 114. While a single communication lead is shown for clarity, one or more temperature sensor(s) may be linked to the controller 148 by multiple leads or a wireless connection, such as by an infra-red data link or another suitable means.

During the crystal growing process, an initial charge of semiconductor or solar-grade material is melted in the crucible 126, and a desired type and amount of dopant is added to the melt 112 to modify the base resistivity of the resulting ingot 114. The seed crystal 204 is lowered by the crystal puller 116 into the melt 112 and then slowly raised from the melt 112. As the seed crystal 204 is slowly raised from the melt 112, atoms from the melt 112 align themselves with and attach to the seed crystal 204 to form an ingot 114. Feedstock material 122 is added to melt 112 while the ingot 114 is pulled from the melt 112 to replenish the melt 112 and maintain a desired dopant concentration in the melt 112.

Volatile dopants, when used in the crystal growing process, are typically added to the melt 112 just prior to initiation of the crystal growing process to reduce losses associated with evaporation of the volatile dopants. The dopants are typically added to the outer melt zone 136 to avoid disturbing the melt surface in the inner melt zone 138. As a result, a portion of the seed end of the ingot 114 has a lower dopant concentration, and thus a higher resistivity, than the remainder of the crystal ingot, resulting in a high resistivity transient region. The term "volatile dopants" generally refers to dopants that have a tendency to evaporate when introduced into a melt of semiconductor or solar-grade material, and generally have an evaporation coefficient of at least 0.0001 cm/s. Examples of volatile dopants include indium, antimony, and gallium.

The liquid doping apparatus described herein facilitate reducing or eliminating the high resistivity transient region by enabling direct doping of the inner melt zone 138 and initiation of crystal growth in relatively rapid succession. In some embodiments, for example, the doping apparatus described herein include one or more dopant containers and a seed crystal each connected to a common seed chuck. The doping apparatus described herein are thereby capable of doping the melt 112 and initiating crystal growth without removing the apparatus from the growth chamber 104.

Figure 2:
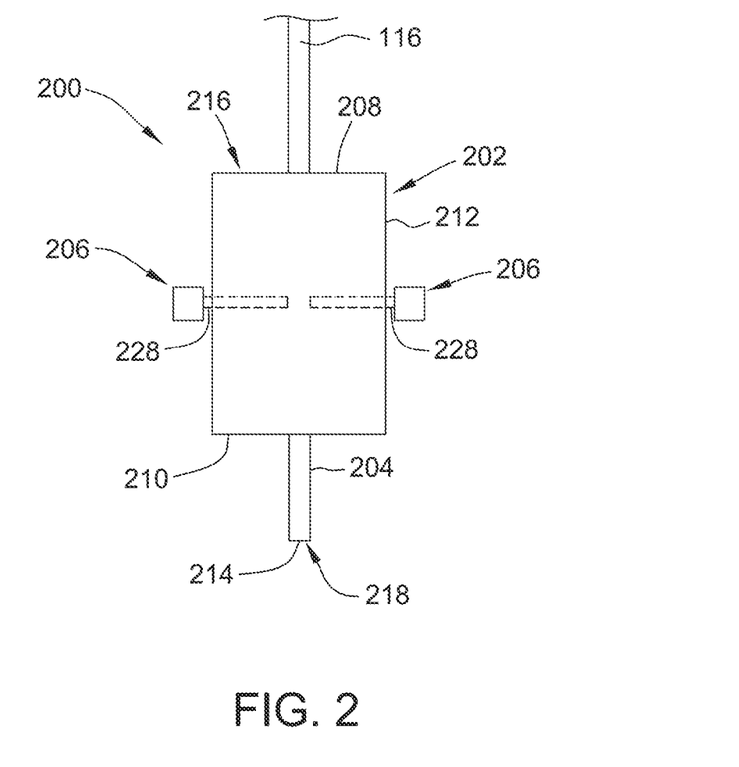
FIG. 2 is a cross-section of the doping apparatus of FIG. 1 showing two dopant containers.
Figure 3:
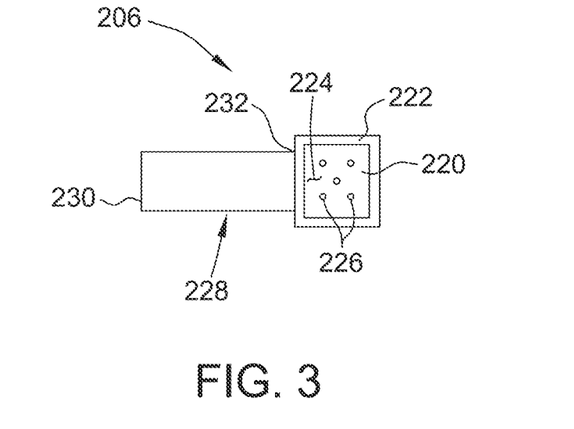
FIG. 3 is a top plan view of one of the dopant containers of the doping apparatus of FIG. 2.

With additional reference to FIGS. 2 and 3, the seed chuck 202 includes a first end 208 connected to the crystal puller 116, a second end 210 opposite the first end 208, and an outer periphery 212 extending between the first end 208 and the second end 210. The seed chuck 202 includes a fastening mechanism (not shown) configured to secure the seed crystal 204 proximate the second end 210 of the seed chuck 202. In one suitable embodiment, for example, the seed chuck 202 has a bore (not shown) defined in the second end 210 configured to receive the seed crystal 204 therein, and radially adjustable jaws configured to secure (i.e., clamp) the seed crystal 204 within the bore. In the illustrated embodiment, the seed chuck 202 has a generally annular shape, although the seed chuck 202 may have any suitable configuration that enables the doping apparatus 200 to function as described herein.

The seed crystal 204 is connected to the seed chuck 202, and projects from the second end 210 of the seed chuck 202. In the example embodiment, a first end (not shown) of the seed crystal 204 is secured within the bore in the second end 210 of the seed chuck 202, and a second end 214 of the seed crystal 204 extends out of the bore and away from the second end 210 of the seed chuck 202. The seed crystal 204 is configured to initiate crystal growth when placed in contact with the melt 112. In particular, when the seed crystal 204 is lowered into contact with melt 112, atoms from the melt 112 solidify and align themselves with the seed crystal 204 to form the ingot 114. The seed crystal 204 may be constructed from the same material as the melt 112, or any other material that has the desired crystalline structure of the ingot 114.

As shown in FIG. 2, the first end 208 of the seed chuck 202 defines a first end 216 of the doping apparatus 200, and the second end 214 of the seed crystal 204 defines a second end 218 of the doping apparatus 200. Each dopant container 206 is connected to the seed chuck 202 and is positioned between the first end 216 and the second end 218 of the doping apparatus 200 and, more specifically, between the first end 208 of the seed chuck 202 and the second end 210 of the seed chuck 202. Each dopant container 206 is positioned a distance sufficiently near the second end 218 of the doping apparatus 200 such that, when the doping apparatus 200 is positioned proximate the melt, thermal energy from the melt 112 and other components of the crystal growing system 100 is sufficient to melt dopant stored within the dopant containers 206. Additionally, each dopant container 206 is positioned a sufficient distance from the second end 218 of the doping apparatus 200 such that the dopant containers 206 do not contact the melt 112 when the seed crystal 204 is lowered into contact with melt 112.

Referring to FIG. 3, each dopant container 206 includes a bottom wall 220 (broadly, a base) and a sidewall 222 extending upward from and around the perimeter of the bottom wall 220. The illustrated dopant container 206 has a generally rectangular shape, although it is understood that the dopant containers 206 may have any suitable shape that enables the doping apparatus 200 to function as described herein. In other suitable embodiments, for example, one or more dopant containers may have a conical shape or a cylindrical shape.

The bottom wall 220 and sidewall 222 cooperatively define a dopant reservoir 224 configured to hold dopant therein. In one suitable embodiment, the volume of the dopant reservoir 224 is between about 5 cubic centimeters ($cm^3$) and about 50 $cm^3$, more suitably between about 10 $cm^3$ and about 30 $cm^3$, and even more suitably between about 15 $cm^3$ and about 20 $cm^3$. In other suitable embodiments, the volume of the dopant reservoir 224 may be less than about 5 $cm^3$ or greater than about 50 $cm^3$.

The bottom wall 220 has a plurality of dispensing orifices 226 defined therein extending through the thickness of the bottom wall 220 and providing fluid communication with the dopant reservoir 224. The illustrated embodiment includes five dispensing orifices 226, although the dopant container 206 may include more or less than five dispensing orifices 226. Each dispensing orifice 226 is sized and shaped to inhibit the passage of solid dopant therethrough, and to permit liquefied dopant to flow outward from the dopant reservoir 224. In the illustrated embodiment, each of the illustrated dispensing orifices 226 has a generally circular shape and a diameter of about 0.1 centimeters (cm). In other suitable embodiments, one or more dispensing orifices may have a diameter greater than or less than about 0.1 cm, such as about 0.5 cm, and/or have a shape other than a generally circular shape.

The dopant containers 206 are suitably constructed from high-temperature materials that can withstand the growth conditions (e.g., high temperatures) experienced during the crystal growing process such that the dopant containers 206 can be used in multiple doping and growth procedures (i.e., reused). The dopant containers 206 can be constructed from a variety suitable materials including, for example and without limitation, high-refractory, relatively inert materials. In one suitable embodiment, for example, the dopant containers 206 are each constructed from quartz. In another suitable embodiment, the dopant containers 206 are each constructed from silicon-coated graphite. In another suitable embodiment, the dopant containers 206 are each constructed from silicon or a silicon-based alloy. Dopant containers constructed from silicon or silicon-based alloys may be positioned further from the second end 218 of the doping apparatus 200 than, for example, a dopant container constructed from quartz to prevent loss of the structural integrity of the dopant container during the crystal growing process.

The illustrated doping apparatus 200 includes two dopant containers 206, although the doping apparatus 200 may include any suitable number of dopant containers 206 that enables the doping apparatus 200 to function as described herein. In the illustrated embodiment, the dopant containers 206 are spaced equally around the periphery 212 of the seed chuck 202. That is, the dopant containers 206 are positioned diametrically opposite one another. In other suitable embodiments, the dopant containers 206 may be spaced about the periphery 212 at any suitable distance from one another that enables the doping apparatus 200 to function as described herein.

In the embodiment illustrated in FIGS. 2 and 3, each dopant container 206 is connected to the seed chuck 202 by an arm 228 extending radially outward from the seed chuck 202. More specifically, each arm 228 includes a first end 230 connected to the seed chuck 202, and a second end 232 connected to one of the dopant containers 206. The arms 228 may be connected to the seed chuck 202 by any suitable fastening mechanisms including, for example and without limitation, complementary threaded fasteners, pins, bayonet-type fasteners, a frictional fit, and combinations thereof. In the embodiment illustrated in FIGS. 2 and 3, each arm 228 is formed integrally with one of the dopant containers 206. That is, each arm 228 and one of the dopant containers 206 are formed from a monolithic piece of material, such as fused quartz. In other suitable embodiments, each arm 228 may be formed separately from the dopant containers 206.

In use, the doping apparatus 200 is used to directly dope the inner melt zone 138 (specifically, the growth zone 142), and grow the ingot 114 from the melt 112. More specifically, a desired amount and type of dopant is loaded into each of the dopant containers 206. In some suitable embodiments, the dopant containers 206 are loaded while the doping apparatus 200 is removed from the growth chamber 104. In some suitable embodiments, the dopant includes at least one of indium, antimony, and gallium. The doping apparatus 200 is lowered towards the melt 112 with the crystal puller 116 until the dopant containers 206 are positioned sufficiently near the melt 112 to liquefy the dopant within the dopant containers 206. Dopant within the dopant containers 206 is liquefied and introduced into the inner melt zone 138 through the dispensing orifices 226 defined in the bottom wall 220 of each of the dopant containers 206. The seed crystal 204 is lowered into contact with the melt 112 to initiate growth of the ingot 114, and the doping apparatus 200 is raised using the crystal puller 116 to grow the ingot 114. In some suitable embodiments, the dopant is introduced and crystal growth is initiated without removing the doping apparatus 200 from the growth chamber 104. Further, in some suitable embodiments, the dopant containers 206 are refilled with dopant and used in subsequent doping and crystal growing procedures.

Figure 4:
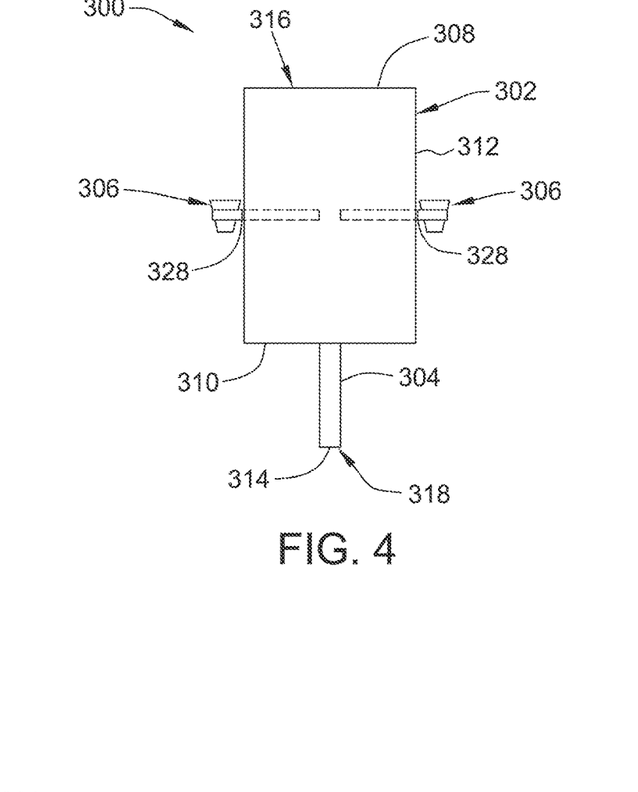
FIG. 4 is a cross-section of another suitable embodiment of a doping apparatus including two dopant containers.

FIG. 4 is a cross-section of another suitable embodiment of a doping apparatus, indicated generally at 300, suitable for use with the crystal growing system 100 of FIG. 1. The doping apparatus 300 includes a seed chuck 302, a seed crystal 304, and a pair of dopant containers 306. The doping apparatus 300 is substantially identical to the doping apparatus 200 illustrated and described above with reference to FIGS. 2 and 3, except the dopant containers 306 are formed separately from linking arms (described below) used to connect the dopant containers 306 to the seed chuck 302.

The seed chuck 302 includes a first end 308 adapted for connection to the crystal puller 116 (FIG. 1), a second end 310 opposite the first end 308, and an outer periphery 312 extending between the first end 308 and the second end 310. Unless otherwise noted, the seed chuck 302 is identical to and performs identical functions as the seed chuck 202 described above with reference to FIGS. 1-3.

The seed crystal 304 includes a first end (not shown) secured within a bore hole (not shown) defined in the seed chuck 302, and a second end 314 extending out of the bore hole and away from the second end 310 of the seed chuck 302. Unless otherwise noted, the seed crystal 304 is identical to and performs identical functions as the seed crystal 204 described above with reference to FIGS. 1-3.

As shown in FIG. 4, the first end 308 of the seed chuck 302 defines a first end 316 of the doping apparatus 300, and the second end 314 of the seed crystal 304 defines a second end 318 of the doping apparatus 300. Each dopant container 306 is connected to the seed chuck 302 and is positioned between the first end 316 and the second end 318 of the doping apparatus 300 and, more specifically, between the first end 308 of the seed chuck 302 and the second end 310 of the seed chuck 302. Each dopant container 306 is positioned a distance sufficiently near the second end 318 of the doping apparatus 300 such that, when the doping apparatus 300 is positioned proximate the melt 112, thermal energy from the melt 112 and other components of the crystal growing system 100 is sufficient to melt dopant stored within the dopant containers 306. Additionally, each dopant container 306 is positioned a sufficient distance from the second end 318 of the doping apparatus 300 such that the dopant containers 306 do not contact the melt 112 when the seed crystal 304 is lowered into contact with melt 112.

Figure 5:
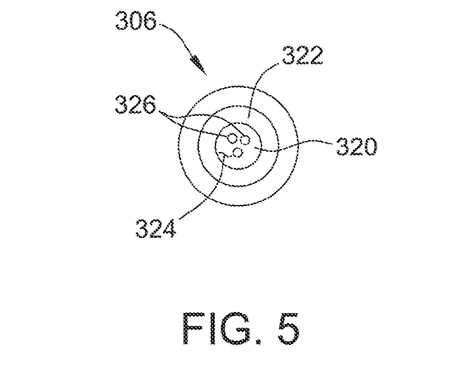
FIG. 5 is a top plan view of one of the dopant containers of the doping apparatus of FIG. 4.

Referring to FIG. 5, each dopant container 306 includes a bottom wall 320 (broadly, a base) and a conical sidewall 322 extending upward from and around the perimeter of the bottom wall 320. The illustrated dopant container 306 has a generally frustoconical shape (i.e., a truncated cone), although it is understood that the dopant containers 306 may have any suitable shape that enables the doping apparatus 300 to function as described herein. In other suitable embodiments, for example, one or more dopant containers may have a cylindrical shape or a rectangular shape.

The bottom wall 320 and sidewall 322 cooperatively define a dopant reservoir 324 configured to hold dopant therein. In one suitable embodiment, the volume of the dopant reservoir 324 is between about 5 cm$^3$ and about 50 cm$^3$, more suitably between about 10 cm$^3$ and about 30 cm$^3$, and even more suitably between about 15 cm$^3$ and about 20 cm$^3$. In other suitable embodiments, the volume of the dopant reservoir 324 may be less than about 5 cm$^3$ or greater than about 50 cm$^3$, such as about 100 cm$^3$.

The bottom wall 320 has a plurality of dispensing orifices 326 defined therein extending through the thickness of the bottom wall 320 and providing fluid communication with the dopant reservoir 324. The illustrated embodiment includes three dispensing orifices 326, although the dopant container 306 may include more or less than three dispensing orifices 326. Each dispensing orifice 326 is sized and shaped to inhibit the passage of solid dopant therethrough, and to permit liquefied dopant to flow outward from the dopant reservoir 324. In the illustrated embodiment, each of the illustrated dispensing orifices 326 has a generally circular shape and a diameter of about 0.1 cm. In other suitable embodiments, one or more dispensing orifices may have a diameter greater than or less than about 0.1 cm, such as about 0.5 cm, and/or have a shape other than a generally circular shape.

The dopant containers 306 are suitably constructed from high-temperature materials that can withstand the growth conditions (e.g., high temperatures) experienced during the crystal growing process such that the dopant containers 306 can be used in multiple doping and growth procedures (i.e., reused). The dopant containers 306 can be constructed from a variety of suitable materials including, for example and without limitation, high-refractory, relatively inert materials. In one suitable embodiment, for example, the dopant containers 306 are each constructed from quartz. In another suitable embodiment, the dopant containers 306 are each constructed from silicon-coated graphite. In another suitable embodiment, the dopant containers 306 are each constructed from silicon or a silicon-based alloy. Dopant containers constructed from silicon or silicon-based alloys may be positioned further from the second end 318 of the doping apparatus 300 than, for example, a dopant container constructed from quartz to prevent loss of the structural integrity of the dopant container during the crystal growing process.

The illustrated doping apparatus 300 includes two dopant containers 306, although the doping apparatus 300 may include any suitable number of dopant containers 306 that enables the doping apparatus 300 to function as described herein. In the illustrated embodiment, the dopant containers 306 are spaced equally around the periphery 312 of the seed chuck 302. That is, the dopant containers 306 are positioned diametrically opposite one another. In other suitable embodiments, the dopant containers 306 may be spaced about the periphery 312 at any suitable distance from one another than enables the doping apparatus 300 to function as described herein.

Figure 6:
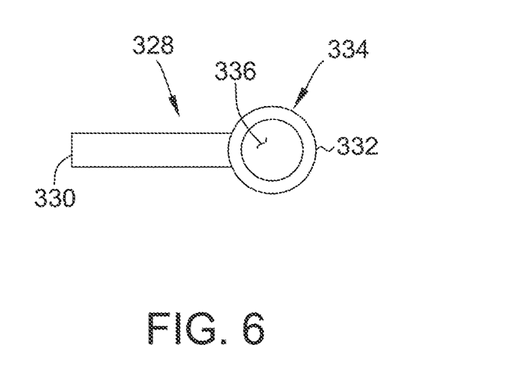
FIG. 6 is a top plan view of an arm suitable for use with the doping apparatus and dopant containers of FIGS. 4 and 5.

With additional reference to FIG. 6, each dopant container 306 is connected to the seed chuck 302 by an arm 328 that extends radially outward from the seed chuck 302. More specifically, each arm 328 includes a first end 330 adapted for connection to the seed chuck 302, and a second end 332 distal from the first end 332. The arms 328 may be connected to the seed chuck 302 by any suitable fastening mechanisms including, for example and without limitation, complementary threaded fasteners, pins, bayonet-type fasteners, a frictional fit, and combinations thereof.

In the embodiment illustrated in FIGS. 4-6, each arm 328 includes a container support 334 disposed proximate the second end 332 and configured to releasably hold one of the dopant containers 306 therein. In the illustrated embodiment, the container support 334 is an annular rim defining an opening 336 sized and shaped to receive a portion of one of the dopant containers 306 therein. The container support 334 is configured to engage the outwardly tapered sidewall 322 of one of the dopant containers 306 when one of the dopant containers 306 is inserted into the opening 336, and thereby impede the dopant container 306 from completely passing through the opening 336.

The arms 328 are formed separately from the dopant containers 306, and may be constructed from a variety of suitable materials including, for example and without limitation, high-refractory materials. In one suitable embodiment, for example, one or more arms 328 may be constructed from graphite. In another suitable embodiment, one or more arms 328 may be constructed from quartz.

Figure 7:
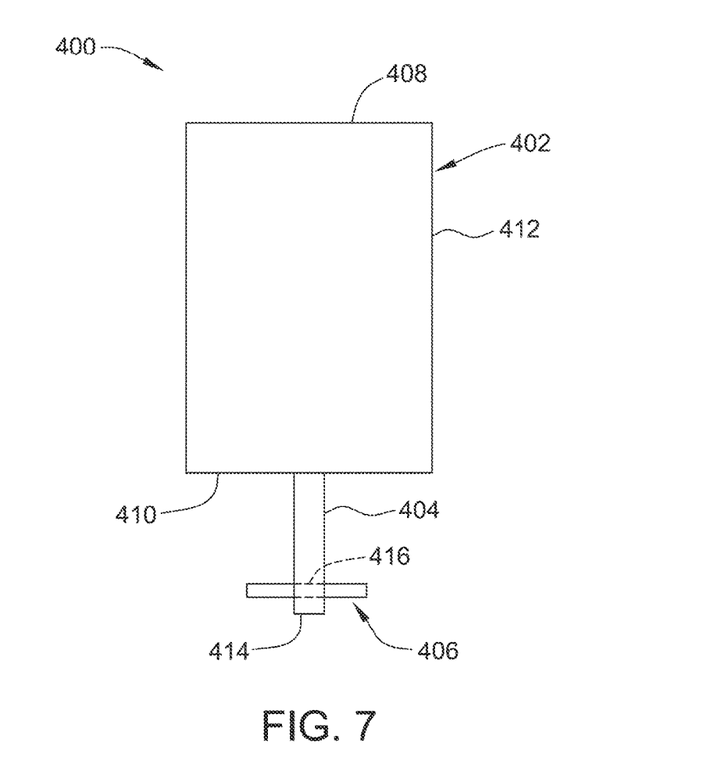
FIG. 7 is a cross-section of another suitable embodiment of a doping apparatus including a dopant bar.

FIG. 7 is a cross-section of another suitable embodiment of a doping apparatus, indicated generally at 400, suitable for use with the crystal growing system 100 of FIG. 1. The doping apparatus 400 includes a seed chuck 402, a seed crystal 404, and a dopant bar 406 connected to the seed crystal 404.

The seed chuck 402 includes a first end 408 adapted for connection to the crystal puller 116 (FIG. 1), a second end 410 opposite the first end 408, and an outer periphery 412 extending between the first end 408 and the second end 410. Unless otherwise noted, the seed chuck 402 is identical to and performs identical functions as the seed chuck 402 described above with reference to FIGS. 1-3.

The seed crystal 404 includes a first end (not shown) secured within a bore hole (not shown) defined in the seed chuck 402, and a second end 414 extending out of the bore hole and away from the second end 410 of the seed chuck 402. The seed crystal 404 includes a bore hole 416 proximate the second end 414 of the seed crystal 404 that extends transversely through the seed crystal 404. The bore hole 416 is sized and shaped to receive the dopant bar 406 therein. Unless otherwise noted, the seed crystal 404 is identical to and performs identical functions as the seed crystal 404 described above with reference to FIGS. 1-3.

The dopant bar 406 is secured within the bore hole 416 of the seed crystal 404, and is configured to be immersed in the melt 112 when the seed crystal 404 is lowered into contact with the melt 112. The dopant bar 406 suitably comprises a desired dopant concentration. In some suitable embodiments, the dopant bar 406 may comprise pure dopant. In other suitable embodiments, a desired amount of dopant may be mixed or alloyed with another material, such as the base material used to prepare the melt 112 (e.g., silicon). In one suitable embodiment, the dopant bar 406 is formed by melting the dopant (or dopant alloy mix), immersing the seed crystal 404 into the dopant melt, and allowing the dopant to solidify within the bore hole 416 and around the seed crystal 404.

In use, the doping apparatus 400 is lowered towards the melt 112 to introduce dopant into the melt 112. As the dopant bar 406 approaches the melt 112, the dopant bar 406 melts, and liquid dopant is introduced into the melt 112. The dopant bar 406 may be submerged in the melt 112 to ensure complete melting and dispersion of the dopant within the melt 112. The second end 414 of the seed crystal 404 is submerged in the melt 112 at least up to the top of the bore hole 416 such that the portion of the seed crystal 404 containing the bore hole 416 is melted in the melt 112. The seed crystal 404 is then slowly raised from the melt 112 to grow a crystal ingot from the melt 112.

Embodiments of the crystal growing systems described herein provide several advantages over known crystal growing systems. For example, the crystal growing systems of the present disclosure enable doping of an inner melt zone and initiation of crystal growth in the inner melt zone in relatively rapid succession. More specifically, the doping apparatus described herein include one or more dopant containers and a seed crystal each connected to a common seed chuck. The seed crystal is configured to initiate crystal growth, and the dopant containers are configured to dispense dopant into the melt. The doping apparatus can thereby introduce dopant directly into the inner melt zone, and initiate crystal growth without having to interchange components or remove components (e.g., the dopant containers, the seed chuck, or the seed crystal) from the growth chamber. As a result, the dopant concentration of the inner melt zone at the time crystal growth is initiated can be more precisely controlled within a desired range. The crystal growing systems and apparatus described herein thereby facilitate reducing or eliminating the high resistivity transient region typically found in semiconductor or solar grade crystals doped with volatile dopants.

EXAMPLES

The following examples are non-limiting.

Two indium-doped silicon crystal ingots were grown according to a continuous Czochralski method under nearly identical growth conditions, except one ingot was grown using a doping apparatus substantially similar to the doping apparatus 300 illustrated in FIG. 4. Both ingots were grown using a crucible assembly including a crucible, an outer weir separating an outer melt zone of the melt from an inner melt zone of the melt, and an inner weir defining a growth zone from which the ingots were grown.

Example 1

Indium-Doped Monocrystalline Silicon Ingot Grown by Continuous Czochralski Method The first ingot was grown by a continuous Czochralski method in which 50 grams (g) of indium dopant were introduced into the outer melt zone of a silicon melt prior to initiation of crystal growth. Crystal growth was initiated approximately 5 minutes after the indium dopant was introduced into the outer melt zone. During the crystal growing process, solid polysilicon feedstock was added to the outer melt zone at a rate of about 5-10 kilograms (kg) per hour (kg/hr), and indium dopant was added to the outer melt zone at a rate of about 3-5 g/hr. The ingot was grown to a diameter of about 200 mm, and the body of the ingot (i.e., the portion of the ingot between the seed cone and end cone of the ingot) was grown to a length of about 2600 mm.

The ingot was sliced into wafers having a thickness of about 2 mm using, for example, an ID saw or a band saw. Wafers were selected for analysis from various lengths from the seed cone. The wafers were tested for resistivity at the center of the wafer and at 6 mm from the edge of the wafer. These data are displayed graphically in FIG. 8. Square data points 802 and the dashed line 804 represent resistivity measurements at the wafer centers. Circular data points 806 and the solid line 808 represent resistivity measurements taken at 6 mm from the edge of the wafers.

Example 2

Indium-Doped Monocrystalline Silicon Ingot Grown by Continuous Czochralski Method The second indium-doped monocrystalline silicon ingot was grown by a continuous Czochralski method using similar growth conditions as the first ingot, except indium dopant was introduced into the inner melt zone using a doping apparatus substantially similar to the doping apparatus 300 illustrated in FIG. 4. More specifically, 30 grams of indium dopant were placed in each of two dopant containers, each connected to a seed chuck by an arm. The seed chuck was lowered towards a silicon melt until the dopant containers were positioned sufficiently near the melt surface such that indium dopant within the containers was melted from the heat from the melt and other components of the crystal growing system. The liquefied dopant was introduced into the inner melt zone through dispensing orifices defined in the base of each dopant container. Crystal growth was initiated approximately 30 minutes after the indium dopant was melted and introduced into the inner melt zone.

During the crystal growing process, solid polysilicon feedstock was added to the outer melt zone at a rate of about 5-10 kg/hr, and indium dopant was added to the outer melt zone at a rate of about 2-3 g/hr. The ingot was grown to a diameter of about 200 mm, and the body of the ingot was grown to a length of about 2600 mm.

The ingot was sliced into wafers having a thickness of about 2 mm using, for example, an ID saw or a band saw. Wafers were selected for analysis from various lengths from the seed cone. The wafers were tested for resistivity at the center of the wafer and at 6 mm from the edge of the wafer. These data are displayed graphically in FIG. 9. Square data points 902 and the dashed line 904 represent resistivity measurements at the wafer centers. Circular data points 906 and the solid line 908 represent resistivity measurements taken at 6 mm from the edge of the wafers.

Figure 8:
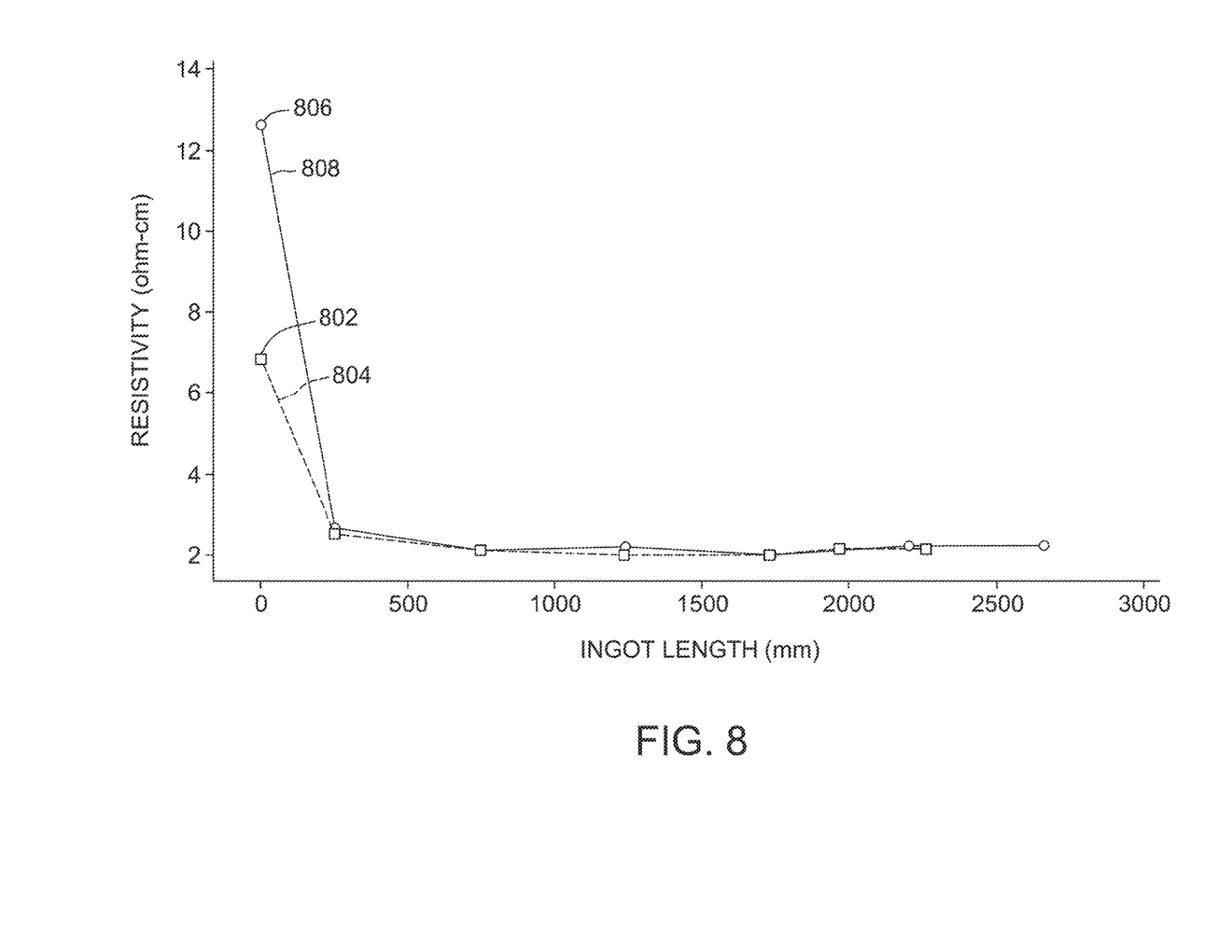
FIG. 8 is graph of the axial resistivity profile of an indium-doped silicon ingot grown according to a continuous Czochralski method.
Figure 9:
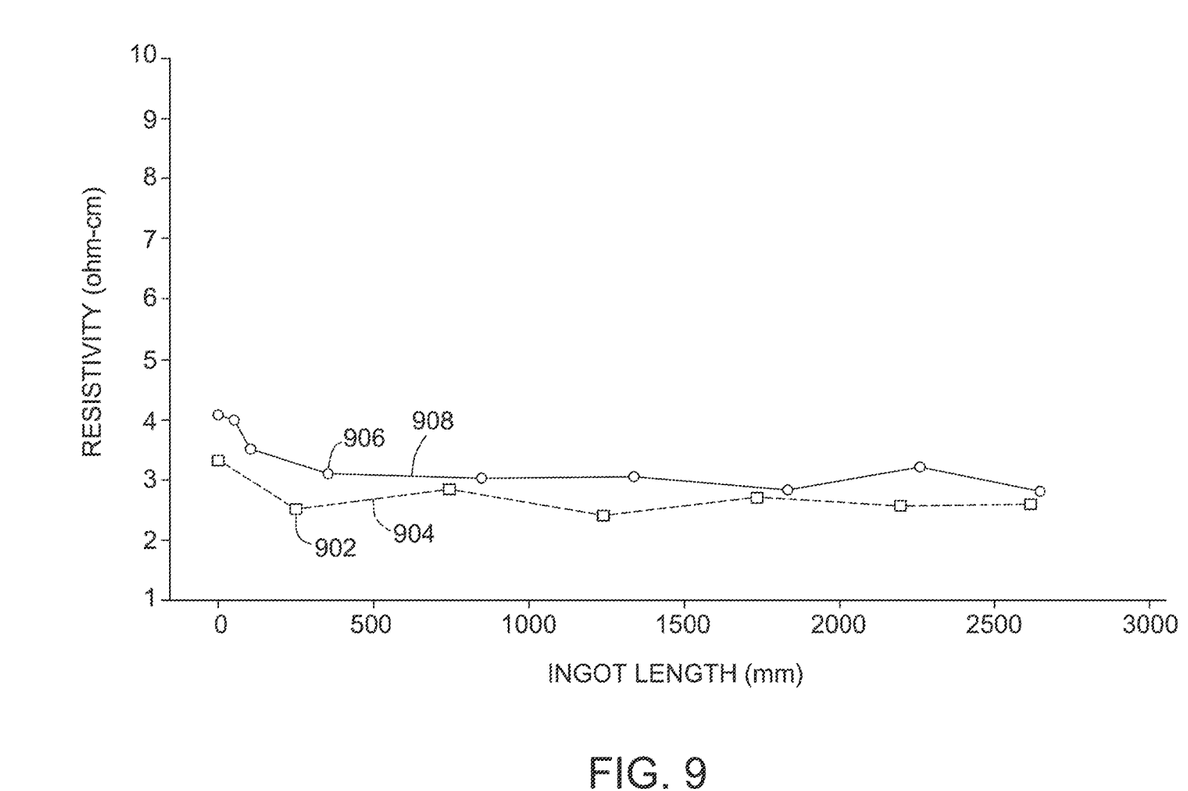
FIG. 9 is graph of the axial resistivity profile of an indium-doped silicon ingot grown according to a continuous Czochralski method using a doping apparatus in accordance with the present disclosure.

As shown in FIGS. 8 and 9, use of a doping apparatus, such as the doping apparatus described herein, to introduce dopant directly into the inner melt zone and initiate crystal growth significantly reduced the length of the high resistivity transient region. In particular, the first ingot had a high resistivity transient region of about 250 mm, whereas the second ingot had a high resistivity transient region of less than about 100 mm. The reduced length of the high resistivity transient region represents a significant reduction in the unusable portion of the ingot, and thus a significant cost savings in the crystal growing process.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. An apparatus for doping a melt of semiconductor or solar material, the apparatus comprising:
    a seed chuck defining a first end of the apparatus;
    a seed crystal connected to the seed chuck, the seed crystal defining a second end of the apparatus and configured to initiate crystal growth when placed in contact with the melt; and
    a dopant container connected to the seed chuck and positioned between the first end and the second end of the apparatus, the dopant container defining a reservoir for holding dopant therein, the dopant container configured to dispense liquid dopant into the melt, wherein the dopant container and seed crystal are connected to the seed chuck simultaneously.

2. The apparatus of claim 1, wherein the dopant container is reusable.

3. The apparatus of claim 1, wherein the dopant container is attached directly to the seed chuck by an arm, the arm extending radially outward from the seed chuck.

4. The apparatus of claim 3, wherein the arm has a first end connected to the seed chuck and a second end distal from the first end, the arm including a container support disposed at the second end and configured to releasably hold the dopant container.

5. The apparatus of claim 3, wherein the arm is formed integrally with the dopant container.

6. The apparatus of claim 1, wherein the dopant container includes a base and a sidewall extending upward from the base, the base having a dispensing orifice defined therein.

7. The apparatus of claim 1, wherein the container is connected to the seed chuck along an outer periphery of the seed chuck.

8. The apparatus of claim 1, wherein the dopant container is a first dopant container, the apparatus further comprising a second dopant container connected to the seed chuck.

9. The apparatus of claim 1, wherein the dopant container includes at least one of quartz and graphite.

10. A method for growing an ingot from a melt of semiconductor or solar material using a crystal growing system including an apparatus for doping the melt, the apparatus including a seed chuck, a seed crystal, and a dopant container, the seed chuck defining a first end of the apparatus, the seed crystal connected to the seed chuck and defining a second end of the apparatus, the dopant container connected to the seed chuck and positioned between the first end and the second end of the apparatus, the dopant container defining a dopant reservoir for holding dopant therein, the method comprising:
    adding a dopant to the dopant reservoir;
    liquefying the dopant within the dopant reservoir;
    introducing the dopant into the melt while the dopant container is spaced from the melt;
    initiating growth of an ingot by contacting the melt with the seed crystal; and
    growing the ingot by raising the apparatus away from the melt.

11. The method of claim 10, wherein the crystal growing system includes a growth chamber having a crucible disposed therein for containing the melt, wherein introducing the dopant into the melt and initiating growth of the ingot are performed without removing the apparatus from the growth chamber.

12. The method of claim 10, further comprising refilling the dopant container with dopant after growing the ingot.

13. The method of claim 10, wherein introducing the dopant into the melt includes introducing the dopant into the melt through a dispensing orifice in the dopant container.

14. The method of claim 10, wherein the crystal growing system includes a crucible and a weir separating an outer melt zone of the melt from an inner melt zone of the melt, wherein introducing the liquid dopant includes introducing the liquid dopant into the inner melt zone.

15. The method of claim 10, wherein adding a dopant to the dopant reservoir includes adding at least one of indium, gallium, and antimony to the dopant reservoir.

16. A system for growing an ingot from a melt of semiconductor or solar material, the system comprising:
    a crucible for containing the melt of semiconductor or solar material;
    a crystal puller for pulling the ingot from the melt; and
    a doping apparatus connected to the crystal puller, the doping apparatus including:
        a seed chuck defining a first end of the doping apparatus;
        a seed crystal connected to the seed chuck, the seed crystal defining a second end of the doping apparatus and configured to initiate crystal growth when placed in contact with the melt; and
        a dopant container connected to the seed chuck and positioned between the first end and the second end of the apparatus, the dopant container defining a reservoir for holding dopant therein, wherein the doping apparatus is configured to liquefy and dispense dopant to the melt and initiate crystal growth with the seed crystal.

17. The system of claim 16, wherein the dopant container is reusable.

18. The system of claim 16, further comprising a growth chamber, wherein the crucible is disposed within the growth chamber and the crystal puller is configured to pull the ingot from the growth chamber, wherein the doping apparatus is configured to liquefy and dispense dopant to the melt and initiate crystal growth with the seed crystal without removing the doping apparatus from the growth chamber.

19. The system of claim 16, wherein the dopant container is attached directly to the seed chuck by an arm, the arm extending radially outward from the seed chuck.

20. The system of claim 16, wherein the dopant container includes a base and a sidewall extending upward from the base, the base having a dispensing orifice defined therein.

21. The system of claim 16, wherein the dopant container includes at least one of quartz and graphite.

* * * * *